US008319295B2

(12) United States Patent
Collaert et al.

(10) Patent No.: US 8,319,295 B2
(45) Date of Patent: Nov. 27, 2012

(54) USE OF F-BASED GATE ETCH TO PASSIVATE THE HIGH-K/METAL GATE STACK FOR DEEP SUBMICRON TRANSISTOR TECHNOLOGIES

(75) Inventors: Nadine Collaert, Blanden (BE); Paul Zimmerman, Cedar Creek, TX (US); Marc Demand, Saint-Jean-Geest (BE); Werner Boullart, Binkom (BE); Adelina K. Shickova, Leuven (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 908 days.

(21) Appl. No.: 11/971,845

(22) Filed: Jan. 9, 2008

(65) Prior Publication Data
US 2008/0164539 A1 Jul. 10, 2008

Related U.S. Application Data

(60) Provisional application No. 60/879,704, filed on Jan. 10, 2007.

(51) Int. Cl.
*H01L 29/423* (2006.01)
*H01L 21/302* (2006.01)
(52) U.S. Cl. . 257/411; 438/710; 438/719; 257/E21.214; 257/E29.132
(58) Field of Classification Search .................. 257/411; 438/710
See application file for complete search history.

(56) References Cited

U.S. PATENT DOCUMENTS

| 6,259,120 B1* | 7/2001 | Zhang et al. ..................... 257/72 |
| 6,445,030 B1* | 9/2002 | Wu et al. ......................... 257/315 |
| 6,485,988 B2* | 11/2002 | Ma et al. ............................ 438/3 |
| 6,534,809 B2* | 3/2003 | Moise et al. .................. 257/295 |
| 6,737,306 B2* | 5/2004 | Yamazaki et al. ............ 438/155 |
| 2006/0205129 A1* | 9/2006 | Sato et al. ..................... 438/197 |

OTHER PUBLICATIONS

Mogul, et al. Advantages of LDD-Only Implanted Fluorine with Submicron CMOS Technologies, IEEE Transactions on Electron Devices, vol. 44, No. 3, Mar. 1997.
Seo, et al. Improvement in High-κ (HfO2/SiO2) Reliability by Incorporation of Fluorine, IEDM Technical Digest, p. 647-650, 2005.

* cited by examiner

*Primary Examiner* — David Vu
*Assistant Examiner* — Jonathan Han
(74) *Attorney, Agent, or Firm* — Knobbe Martens Olson & Bear LLP

(57) ABSTRACT

A new, effective and cost-efficient method of introducing Fluorine into Hf-based dielectric gate stacks of planar or multi-gate devices (MuGFET), resulting in a significant improvement in both Negative and Positive Bias Temperature Instabilities (NBTI and PBTI) is provided. The new method uses an $SF_6$ based metal gate etch chemistry for the introduction of Fluorine, which after a thermal budget within the standard process flow, results in excellent F passivation of the interfaces. A key advantage of the method is that it uses the metal gate etch for F introduction, requiring no extra implantations or treatments. In addition to the significant BTI improvement with the novel method, a better $V_{th}$ control and increased drive current on MuGFET devices is achieved.

37 Claims, 15 Drawing Sheets

USE OF F-BASED GATE ETCH TO PASSIVATE THE HIGH-K/METAL GATE STACK FOR DEEP SUBMICRON TRANSISTOR TECHNOLOGIES

CROSS-REFERENCE TO RELATED APPLICATIONS

This application claims the benefit under 35 U.S.C. §119 (e) of U.S. provisional application Ser. No. U.S. 60/879,704 filed Jan. 10, 2007, the disclosure of which is hereby expressly incorporated by reference in its entirety and is hereby expressly made a portion of this application.

FIELD OF THE INVENTION

The preferred embodiments are related to the field of gate patterning in planar and multiple-gate devices. More specifically the preferred embodiments are related to the simultaneous incorporation of Fluorine into the gate stack during the patterning of said gate stack. The preferred embodiments are further related to the creation of semiconductor devices with increased lifetime and significant Bias Temperature instability (BTI) improvement. The preferred embodiments are especially beneficial for short channel devices.

BACKGROUND OF THE INVENTION

The introduction of high-k and metal gate materials in scaled CMOS technologies (45 nm node and beyond) faces significant difficulties due to severe threshold voltage instability and performance degradation of the devices. These problems are related to the high amount of bulk defects and interface states in the high-k/metal gate stack. In addition, preferential lateral re-oxidation of the gate dielectric is a significant problem, especially for short channel devices. Proper passivation of the dielectric is crucial in order to overcome these problems.

Passivation of Hf based high-k dielectric materials by Fluorine as possible means to reduce the number of interface and bulk defects is an attractive alternative to H passivation, and was the subject of several recent studies. The reason for this is that Hf and Si bonds formed with F are much stronger compared to Hf—H and Si—H bonds. The strength of the formed bonds allows the passivation to be maintained even throughout the standard high temperature CMOS processing for deep submicron devices, and results in a more robust defect passivation that allows better withstanding of the normal device operation conditions, resulting in improved BTI behavior.

The conventional method for Fluorine introduction is by means of implantation techniques. However, several implantations during the gate stack deposition are needed in order to passivate the entire dielectric. The incorporation of Fluorine in an $HfO_2$ comprising high-k stack using implantation techniques is described by Seo et al (IEDM Technical Digest, p. 647-650, 2005). However, implanting Fluorine during the gate stack deposition may lead to uncontrolled oxide re-growth as described by Mogul et al (IEEE Trans. Electron Dev., pp. 388-394, 1997).

As a conclusion there is still a need to find a more attractive method to achieve Fluorine incorporation (passivation) in the high-k dielectric material.

SUMMARY OF THE INVENTION

According to preferred embodiments, a method is provided to increase the lifetime and performance of a semiconductor device comprising a high-k material such as $HfO_2$ by incorporation of Fluorine in the high-k material and more specifically to incorporate or replace the Si—H and Hf—H bonds (especially at the interface of the silicon substrate and $HfO_2$) by Si—F and Hf—F bonds.

According to preferred embodiments a novel method for introducing Fluorine in the high-k dielectric is disclosed.

The novel method relies on the introduction of highly reactive F ions and radicals during the metal gate etch.

Furthermore, according to preferred embodiments a cost-effective method to introduce Fluorine in the high-k dielectric, requiring no extra processing steps and still offering all the benefits of Fluorine passivation is disclosed.

According to preferred embodiments a method for fluorine passivation of a dielectric layer (or for introducing fluorine in a dielectric layer) having a high-k (i.e. a dielectric constant higher than that of $SiO_2$, $k > k_{SiO2}$) is disclosed, said method comprising the steps of:

providing gate stack layers comprising at least (or consisting of) a channel layer (or a substrate, e.g. Si, SOI), a high-k dielectric layer, and a metal gate layer, then exposing said gate stack layers to a fluorine comprising plasma which does not contain carbon, and then, submitting said exposed gate stack layers to a thermal treatment, wherein the temperature is higher than 700° C.

According to preferred embodiments, the fluorine comprising plasma is a plasma that does not contain carbon compounds to avoid carbon deposition onto the sidewalls of the gate structure during patterning (etching) of the gate structure.

According to preferred embodiments, exposing said gate stack layers to said fluorine comprising plasma is performed during the patterning of said gate stack layers.

Preferably, in a preferred embodiment, exposing said gate stack layers to said fluorine comprising plasma is performed simultaneously with or (immediately) after the dry etching of said gate stack layers.

More particularly, said step of dry etching of said gate stack layers and said step of exposing said gate stack layers to said fluorine comprising plasma are performed consecutively.

According to preferred embodiments, said step of exposing said gate stack layers to said fluorine comprising plasma consists of a dry etching of said metal gate using said fluorine comprising plasma.

Preferably, said fluorine comprising plasma is a $SF_6$ comprising plasma.

More preferably, said fluorine comprising plasma further comprises $O_2$.

More preferably, said fluorine comprising plasma further comprises $N_2$.

According to preferred embodiments, said fluorine comprising plasma comprises (or consists of) a mixture of $SF_6$ and $O_2$.

According to preferred embodiments, said fluorine comprising plasma comprises (or consists of) a mixture of $SF_6$ and $N_2$.

According to preferred embodiments, said gate stack layers are exposed to a $BCl_3$ comprising plasma prior to exposing said gate stack layers to said fluorine comprising plasma.

More particularly, said metal gate is etched, preferably partially etched, using a $BCl_3$ comprising plasma prior to exposing said gate stack layers to said fluorine comprising plasma.

More preferably, the remaining metal gate layer, corresponding preferably to 10% to 50% of the initial thickness of said metal gate layer, is etched using said fluorine comprising plasma. In other words, said exposure to said BCl₃ comprising plasma is stopped when 10% to 50% of the thickness of said metal gate layer is left, and then, during said subsequently exposure to said fluorine comprising plasma, said 10% to 50% of the thickness of said metal gate layer is further etched by said fluorine comprising plasma.

More preferably, said BCl₃ comprising plasma further comprises Cl₂.

According to preferred embodiments, said gate stack layers further comprise a capping layer onto the metal gate layer, such as poly-Si.

According to preferred embodiments, said metal gate layer is a layer comprising of (or consisting of) TiN, TaN, TiN/TaN, TaC, WN₂, TiW, WSi₂, MoSi₂, Mo, Ti, or W.

More preferably, said metal gate layer is a layer comprising of (or consisting of) TiN, TaN, TiN/TaN, or W.

Preferably, said metal gate layer is a dual metal gate.

Preferably, said dielectric layer is an Hf comprising layer.

More preferably, said Hf comprising layer is layer comprising of (or consisting of) $HfO_2$.

More preferably, said Hf comprising layer is a layer comprising of (or consisting of) hafnium silicon oxide ($HfSi_xO_y$).

Preferably, said channel layer comprises at least (or, preferably, consists of) Si.

Preferably, said channel layer comprises at least (or, preferably, consists of) Ge.

Preferably, said channel layer comprises at least (or, preferably, consists of) a group III/V element.

According to preferred embodiments, said thermal treatment is performed for at least 2 minutes.

According to preferred embodiments, said thermal treatment step is performed during a Selective Epitaxial growth (SEG) process, or during a Rapid Thermal Anneal (RTA) step.

More preferably, said thermal treatment step is performed during a Selective Epitaxial growth (SEG) process.

According to preferred embodiments, the method as described above is used for the manufacture of a semiconductor device.

More preferably, said semiconductor device is a multiple gate device (e.g. FinFET), said channel layer can be a fin.

According to preferred embodiments, a semiconductor device obtainable by the method described in preferred embodiments is obtained.

More preferably, said semiconductor device is a multiple gate device, such as a FinFET.

The term "high-k" used in the context of the preferred embodiments refers to its well-recognized meaning in the field of semiconductors.

More particularly, the term "high-k" refers to a dielectric constant higher than that of $SiO_2$, $k > k_{SiO2}$.

BRIEF DESCRIPTION OF THE DRAWINGS

All drawings are intended to illustrate some aspects and preferred embodiments. Not all alternatives and options are shown and therefore the invention is not limited to the content of the given drawings.

DETAILED DESCRIPTION OF THE PREFERRED EMBODIMENT

Figure 1:
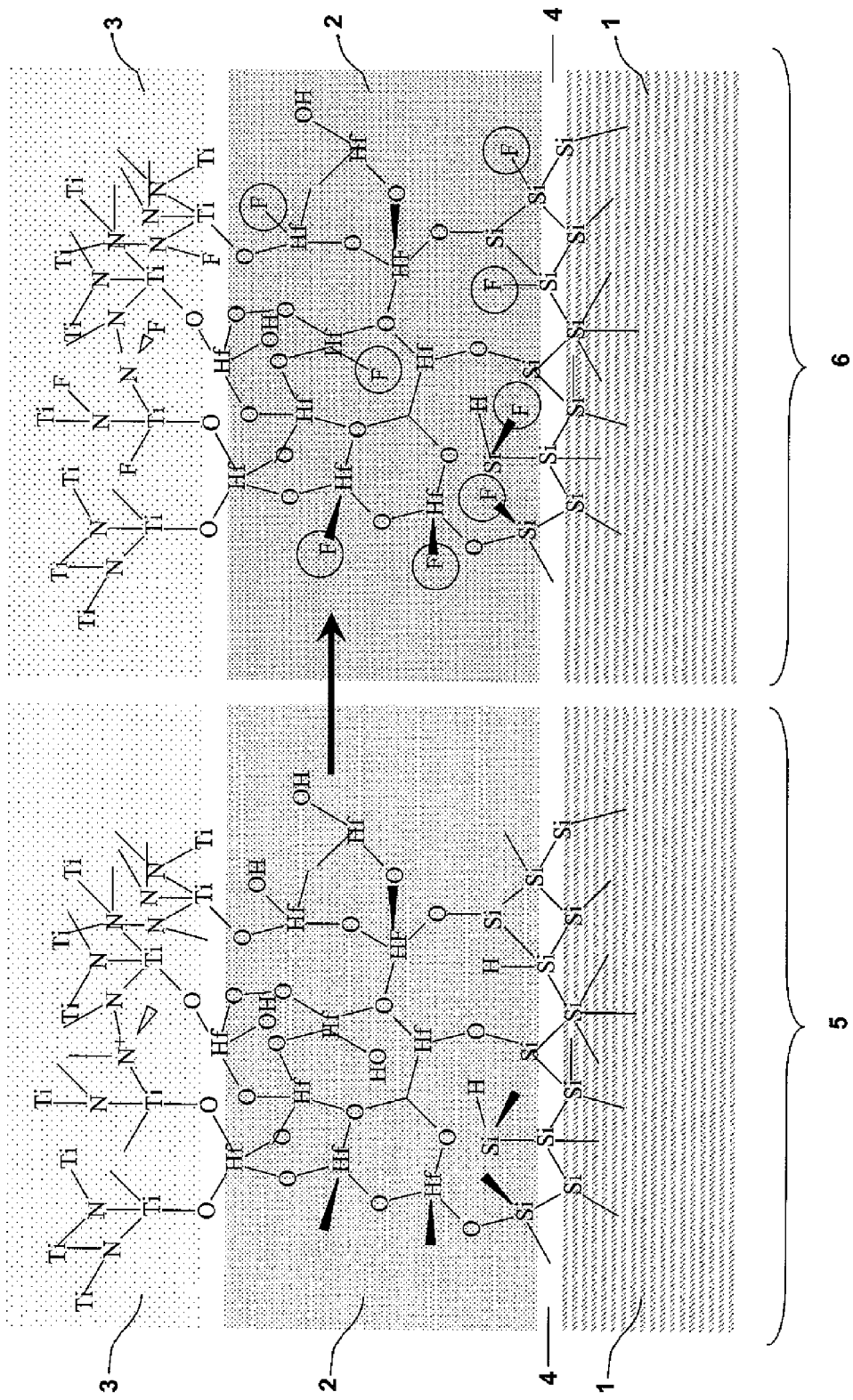
FIG. 1 illustrates the stack of layers after patterning the gate using a BCl₃/Cl₂ chemistry compared to a SF₆/O₂ comprising chemistry to pattern the gate (according to the preferred embodiments) whereby Fluorine is incorporated in the stack.

In relation to the drawings the preferred embodiments are described very briefly and in general in the following. It is apparent, however, that a person skilled in the art knows how to perform the etch process in detail and compose an etch recipe.

It is the goal of the preferred embodiments to increase the lifetime and performance of a semiconductor device comprising a high-k material such as $HfO_2$ by incorporation of Fluorine in the high-k material and more specifically to incorporate or replace the Si—H and Hf—H bonds (especially at the interface of the silicon substrate and $HfO_2$) by Si—F and Hf—F bonds.

It is the goal of the preferred embodiments to propose a novel method of introducing Fluorine in the high-k dielectric. The novel method relies on the introduction of highly reactive F ions and radicals during the metal gate etch.

It is further a goal of the preferred embodiments to propose a cost-effective method to introduce Fluorine in the high-k dielectric, requiring no extra processing steps and still offering all the benefits of Fluorine passivation.

According to preferred embodiments, a method is provided for patterning a gate stack in a semiconductor device.

Said semiconductor device can be either a planar or a multiple gate semiconductor device.

Said gate stack comprises at least a metal gate layer and a high-k dielectric layer.

Optionally said gate stack can further comprise a capping layer onto the metal gate layer (e.g. poly-Si).

During the patterning of at least one of the layers of said gate stack the high-k dielectric layer is fluorinated.

The method starts with the step of providing a stack of layers of at least a gate dielectric layer and on top of said gate dielectric layer a metal gate layer and underneath said gate dielectric layer a channel layer.

In a preferred embodiment, said metal gate layer can be a layer comprising of (or consisting of) TiN, TaN, TiN/TaN, TaC, $WN_2$, TiW, $WSi_2$, $MoSi_2$, Mo, Ti, or W.

According to preferred embodiments the metal gate layer is a TiN, TaN, TiN/TaN, or a W comprising (or consisting of) layer.

According to preferred embodiments the high-k dielectric layer is an Hf comprising layer such as $HfO_2$, or hafnium silicon oxide ($HfSi_xO_y$).

According to preferred embodiments the channel layer is selected from at least one of a Si, Ge or a group III/V element.

In case the semiconductor device is a multiple gate device (e.g. FinFET); said channel layer can be a fin.

The method of the preferred embodiments proceeds with the patterning of the gate stack layers by means of dry etching and performing during the patterning at least one dry etching step and/or exposure step using a Fluorine comprising plasma such that Fluorine is incorporated into the gate stack layers.

According to preferred embodiments the Fluorine comprising plasma is a $SF_6$ comprising plasma such as $SF_6/O_2$.

According to preferred embodiments the Fluorine comprising plasma is a $SF_6$ comprising plasma such as $SF_6$/N2.

After patterning the gate stack, a thermal treatment is preferably performed to activate the Fluorine in the gate stack layers such that it is diffusing in the high-k dielectric layer and stable F-bonds are realized at the interfaces between the gate stack layers.

According to preferred embodiments the thermal treatment step is performed at temperatures above 700° C.

According to preferred embodiments the thermal treatment step is performed at temperatures above 700° C. for several minutes (or for at least 2 minutes).

According to preferred embodiments the thermal treatment step is performed during a Selective Epitaxial (SEG) growth process. This is especially attractive for non-planar devices such as multiple gate devices (MugFET, FinFET, or the like) whereby a standard SEG process step is used for fin regrowth. During the SEG the Fluorine is able to diffuse and bond to the high-k dielectric (e.g. to form Hf—F bonds at the interfaces).

Furthermore, the use of the method described above is provided for etching a gate stack comprising at least one metal gate and a high-k dielectric layer such that Fluorine is incorporated into the gate stack layers and stable F-bonds are realized at the interfaces between the gate stack layers.

Also a semiconductor device obtainable by a method according to the preferred embodiments above is provided.

In a first aspect, a method is provided for patterning a gate stack in a semiconductor device, said gate stack comprising at least a metal gate layer and a high-k dielectric layer and whereby during the patterning of at least one of the layers of said gate stack the high-k dielectric layer is fluorinated such that the dangling bonds are passivated, said method comprising at least the steps of: providing a stack of layers of at least a gate dielectric layer and on top of said gate dielectric layer a metal gate layer and underneath said gate dielectric layer a channel layer, patterning the gate stack layers by means of dry etching and performing during the patterning at least one dry etching step and/or exposure step using a Fluorine comprising plasma such that Fluorine is incorporated into the gate stack layers, and performing a thermal treatment step to activate the Fluorine in the gate stack layers such that it is diffusing in the high-k dielectric layer and stable F-bonds are realized at the interfaces between the gate stack layers.

In an embodiment of the first aspect, said semiconductor device is a planar or a multiple gate semiconductor device.

In a preferred embodiment, said metal gate layer can be a layer comprising of (or consisting of) TiN, TaN, TiN/TaN, TaC, $WN_2$, TiW, $WSi_2$, $MoSi_2$, Mo, Ti, or W.

In an embodiment of the first aspect, said metal gate layer is a TiN, TaN, TiN/TaN, or a W comprising (or consisting of) layer.

In an embodiment of the first aspect, said high-k dielectric layer is an Hf comprising layer such as $HfO_2$, or hafnium silicon oxide ($HfSi_xO_y$).

In an embodiment of the first aspect, said channel layer is selected from at least one of a Si, Ge or a group III/V element.

In an embodiment of the first aspect, said Fluorine comprising plasma is a $SF_6$ comprising plasma such as $SF_6/O_2$.

In an embodiment of the first aspect, said Fluorine comprising plasma is a $SF_6$ comprising plasma such as $SF_6/N_2$.

In an embodiment of the first aspect, said thermal treatment step is performed at temperatures above 700° C.

In an embodiment of the first aspect, said thermal treatment step is performed at temperatures above 700° C. for several minutes (or for at least 2 minutes).

In an embodiment of the first aspect, said thermal treatment step is performed during a Selective Epitaxial growth process.

In an embodiment of the first aspect, said gate stack further comprises a capping layer onto the metal gate layer (e.g. poly-Si).

Use is provided of a method according to any of the above aspects or embodiments for etching a gate stack comprising at least one metal gate and a high-k dielectric layer such that Fluorine is incorporated into the gate stack layers and stable F-bonds are realized at the interfaces between the gate stack layers.

A semiconductor device is provided obtainable by a method according to any of the above aspects or embodiments.

The following description illustrates methods to passivate a high-k dielectric layer by incorporation of Fluorine during the patterning of the gate stack layers. It will be appreciated that there are numerous variations and modifications possible.

The preferred embodiments relate to a new, effective and cost-efficient method of introducing Fluorine into a stack comprising high-k dielectric materials, said high-k comprising stack being part of a planar or multi-gate semiconductor device (MuGFET).

The method of the preferred embodiments is further resulting in a significant improvement in both Negative and Positive Bias Temperature Instabilities (NBTI and PBTI).

According to preferred embodiments, said high-k dielectric material or gate dielectric is preferably an Hf-based material such as $HfO_2$. Said high-k comprising stack further comprises a gate electrode, said gate electrode is preferably a metal gate, a preferred example of said metal gate is TiN, TiN/TaN or TaN but the preferred embodiments are not limited to these metal gate layers only.

The method of the preferred embodiments uses a Fluorine comprising plasma (e.g. an $SF_6$ based metal gate etch chemistry) for the introduction of F into the high-k dielectric, which after a thermal treatment within the standard process flow, results in excellent F passivation at the interfaces of the gate stack layers.

The method of the preferred embodiments has the advantage over existing methods in prior art by using a Fluorine based (e.g. $SF_6$-based) plasma exposure during the patterning of the gate stack for Fluorine introduction such that no extra Fluorine implantations or treatments are required. In addition to a significant Bias Temperature Instability (BTI) improvement, for the first time, a better $V_{th}$ control and increased drive current on MuGFET devices is thereby achieved.

Using the method of the preferred embodiments makes it possible to introduce highly reactive Fluorine ions and radicals during the patterning (in a dry etch chamber) into the high-k dielectric. The method is further characterized as a cost-effective method, requiring no extra processing steps and still offering all the benefits of Fluorine passivation.

The incorporation of Fluorine into the gate dielectric using the method of the preferred embodiments is further characterized as an in-line processing step whereby the Fluorine based (e.g. $SF_6$-based) gate stack etch chemistry not only etches the gate stack (e.g. metal gate layer) but simultaneously incorporates Fluorine in the high-k dielectric layer such that the necessary amount of Fluorine needed to passivate the dielectric layer at the interface is achieved and no additional processing steps are needed to incorporate Fluorine into the high-k dielectric layer.

In a preferred embodiment, the incorporation of Fluorine into the gate stack (more particularly into the high-k dielectric layer) is performed during the dry etching of the metal gate layer using a Fluorine comprising plasma. Said plasma is preferably a $SF_6$ comprising plasma such as $SF_6/O_2$. The Fluorine is preferably such that enough Fluorine is incorporated into the gate stack. Said Fluorine is accumulated at the sidewalls of the gate stack but can be further transported/diffused by means of a thermal treatment step performed after the patterning.

In another and also preferred embodiment, the incorporation of Fluorine into the gate stack (more particularly into the high-k dielectric layer) is performed during the dry etching of the metal gate layer. The patterning of the metal gate layer is performed by means of at least two steps whereby the first step comprises a $BCl_3$ comprising plasma (e.g. $BCl_3/Cl_2$) to etch the bulk of the metal gate layer and a second step using a Fluorine comprising plasma (e.g. $SF_6/O_2$) to etch the remaining metal gate layer and to incorporate Fluorine into the gate stack.

If needed, a supplemental Fluorine plasma exposure can be performed. This extra Fluorine exposure is preferably performed immediately after performing the dry etching of the gate stack layers (in the dry etching chamber). Said Fluorine treatment is preferably performed in a dry etching plasma using a Fluorine based chemistry (plasma) without applying a substrate bias (no etching).

In yet another and also preferred embodiment, the incorporation of Fluorine into the gate stack (more particularly into the high-k dielectric layer) is performed after the patterning of the gate stack by exposure to a Fluorine comprising plasma.

FIG. 1 illustrates at the left side part of the gate stack 5 of a prior art device (also referred to as reference device) after patterning said gate stack using no Fluorine comprising chemistry (using a $BCl_3/Cl_2$ chemistry to pattern the metal gate).

The gate stack shown comprises a metal gate layer (here TiN) 3 with a high-k layer 2 underneath (here $HfO_2$).

Underneath the high-k layer 2 a Si (substrate) 1 is situated.

Also the interface 4 between the Si bulk and the high-k dielectric layer is indicated.

In the prior art device, Si—H and Hf—H bonds are present in the stack after patterning.

On the right side of FIG. 1, the gate stack after patterning according to the preferred embodiments is shown whereby a Fluorine comprising plasma (e.g. $SF_6/O_2$) is used to pattern the gate stack such that Fluorine is incorporated in the high-k dielectric 2.

After applying a thermal treatment step the Fluorine is diffused throughout the bulk of the high-k layer 2 such that passivation of the (dangling bonds) high-k layer is realized (especially at the interfaces 4).

Si—F and Hf—F bonds are indicated in the gate stack.

Compared to existing methods to achieve Fluorine incorporation in the high-k dielectric layer such as ion implantation, the method of the preferred embodiments is a gentle method which avoids damages to the high-k dielectric such as uncontrolled oxide re-growth.

The in-line incorporation of Fluorine during the metal gate etch needs to be carefully balanced in such a way that at the same time optimal passivation of the dangling bonds can be achieved.

Figure 2:
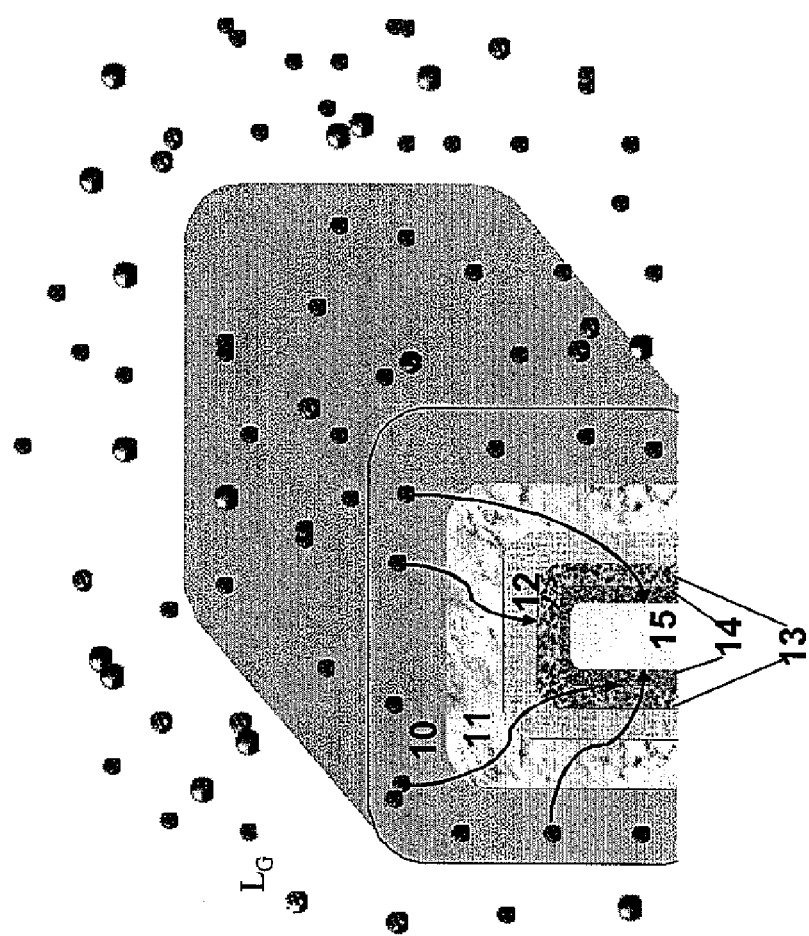
FIG. 2 illustrates the Fluorine diffusion and accumulation in the hard mask during the etch process. Further diffusion of Fluorine species towards the dielectric interfaces can take place due to the thermal budget of the subsequent SEG steps.

FIG. 2 shows a gate stack comprising TiN as metal gate layer 12 and $HfO_2$ as high-k dielectric 13 in a FinFET device (Si fins 15 shown).

The Figure further illustrates the Fluorine diffusion and accumulation in the hard mask 10 during the etch process.

Further diffusion of Fluorine species towards the (high-k) dielectric 13 interfaces can take place during the thermal treatment step.

The thermal treatment step is preferably performed at temperatures above 700° C.

The thermal treatment step is preferably performed at temperatures above 700° C. for several minutes (at least 2 minutes).

According to preferred embodiments, the thermal treatment step can be performed during a Selective Epitaxial growth process.

Furthermore the preferred embodiments provide a semiconductor device obtainable by the preferred methods described above.

EXAMPLES

Example 1

MuGFET Device Fabrication According to a Preferred Embodiment

MuGFET devices have been fabricated on standard [100]/[110] (top surface) SOI substrates with fin height $H_{fin}=60$ nm and fin widths down to 20 nm.

After fin patterning, the devices received a $H_2$ anneal to smoothen the sidewalls and round the corners. The gate stack consists of a 5 nm ALD TiN layer on top of a 2 nm $HfO_2$/1 nm $SiO_2$ gate dielectric.

100 nm poly is used as a capping layer.

After gate stack deposition, an oxide hard mask (HM) is used to pattern the poly-silicon, stopping on the TiN layer.

For the TiN etch, $BCl_3/Cl_2$ was used for the reference devices.

For the other devices, $SF_6/O_2$ is used as gate-etch chemistry. The benefits of this chemistry are that it etches the TiN layer and at the same time introduces the necessary amount of F needed to passivate the interfaces of the high-k dielectric.

This method was demonstrated both for planar and MuGFET devices.

After gate patterning, the extensions were implanted (high angle), and 45 nm recessed RTCVD nitride spacers were formed.

Next, Si selective epitaxial growth (SEG) films were grown at 810° C. on nMOS S/D regions, and SiGe SEG was grown on pMOS at 750° C.

SEG in MuGFET is a key processing step in order to reduce the intrinsically high S/D series resistance.

The thermal budget of this processing step is crucial for the effectiveness of the $SF_6$ chemistry for F passivation.

The SEG thermal budget allows further diffusion of the F and aids Si—F bond formation.

Next, the gate HM was removed and HDD implantations were performed. Dopants were activated with a 1050° C. spike anneal and NiSi was used as a salicide.

Example 2

Gate Etch Processing and Transistor Performance

The metal gate etch processing is schematically depicted shown in FIG. 2. It is an isotropic etch and as consequence it has the same impact on all sides of the device.

During the TiN etch, F diffuses and accumulates in the hard mask (HM).

The thermal budget of the subsequent SEG step (750-810° C.) assists further diffusion of the accumulated F towards the dielectric interfaces. It also provides the necessary activation energy for passivating the interface states and/or for substituting the H atoms in the existing Si—H/Hf—H weaker bonds.

Figure 3:
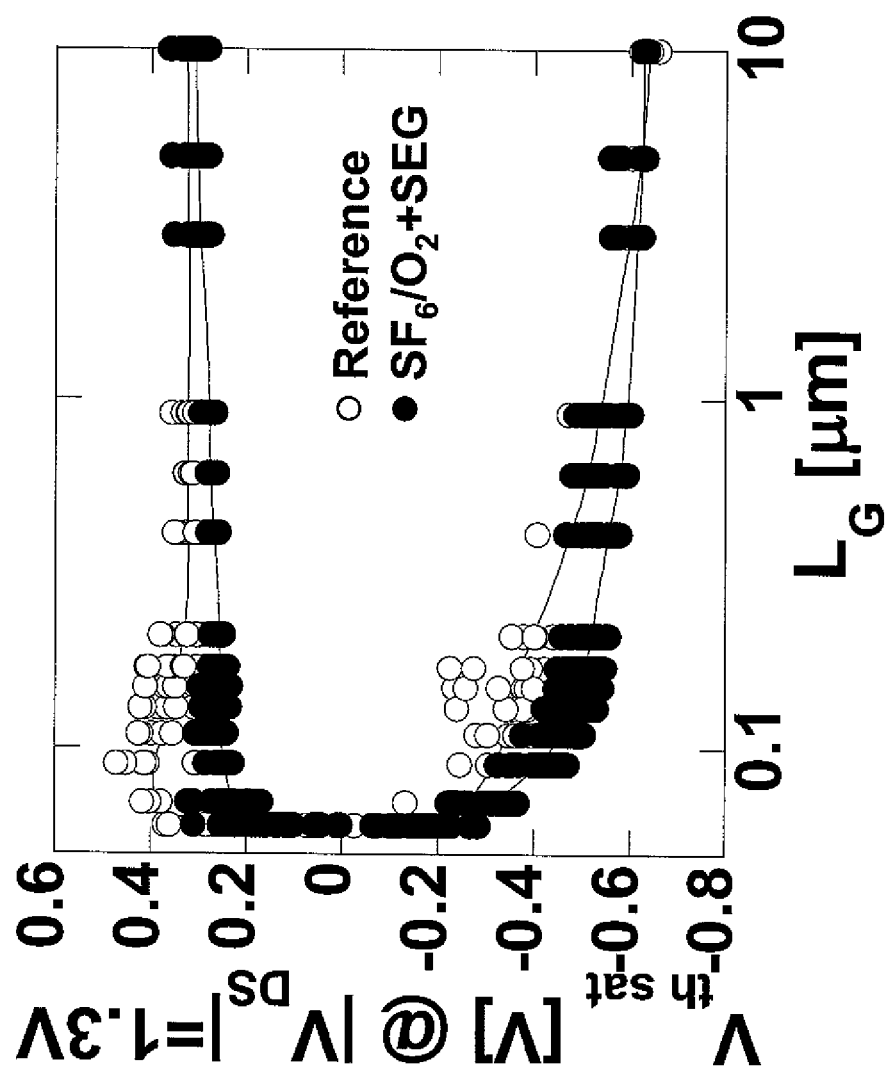
FIG. 3 illustrates the threshold voltage ($V_{th}$) as function of the gate length. No anomalous (roll-up for nMOS and enhanced roll-off for pMOS) $V_{th}$ behavior is seen for the devices having used SF₆/O₂ to pattern the gate according to the method of the preferred embodiments as a contrast to reference BCl₃/Cl₂ patterned (prior art) devices.

FIG. 3 shows the nFET and pFET saturation $V_{th}$ versus gate length (LG).

An anomalous $V_{th}$ behavior is seen for the reference devices (using no $SF_6$ chemistry during the metal gate etch), a roll-up for nMOS and enhanced roll-off for pMOS). This behavior is typically attributed to process damage generated at the gate edges during device fabrication.

The $SF_6/O_2$ devices do not exhibit this behavior indicating that this chemistry neutralizes the gate-edge traps and/or prevents re-oxidation at the edges.

Figure 4:
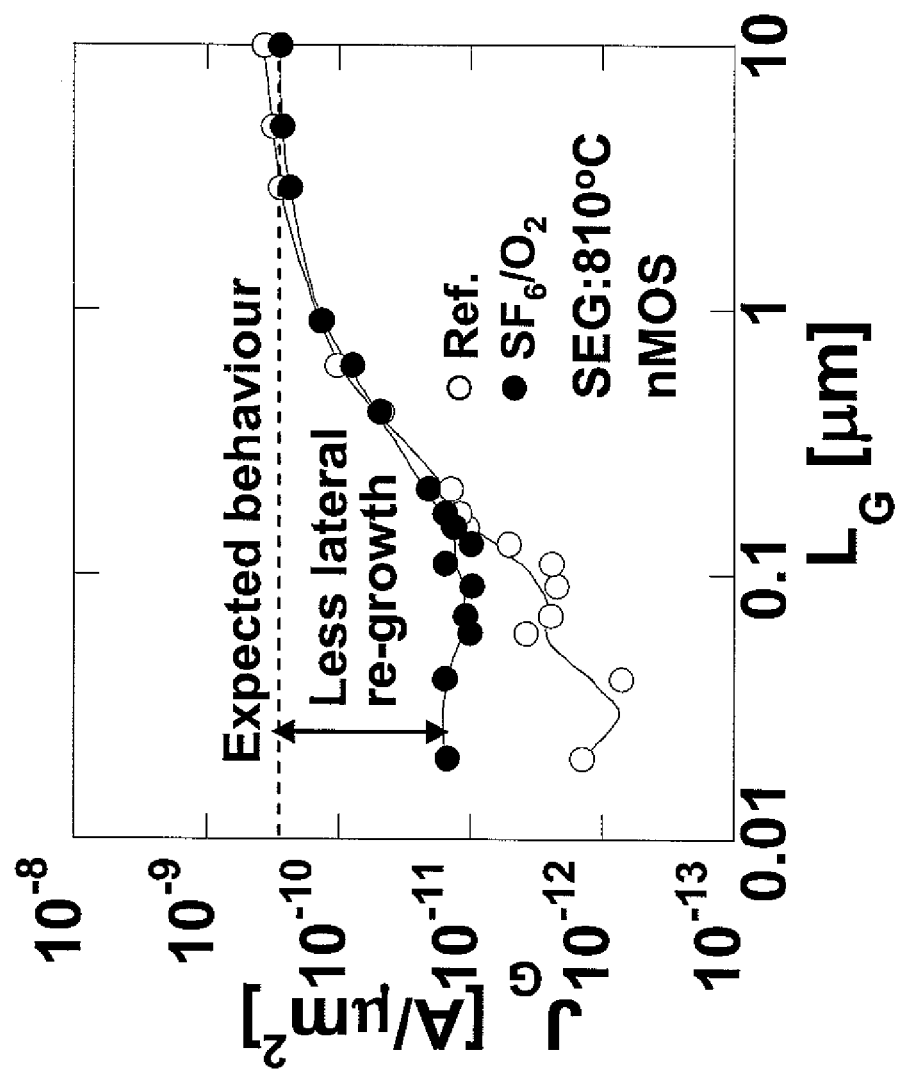
FIG. 4 illustrates the normalized gate leakage as function of gate length. A higher lateral oxide re-growth is seen in devices having used BCl₃/Cl₂ compared to devices having used SF₆/O₂ to pattern the gate according to the method of the preferred embodiments.

This is again demonstrated in FIG. 4 where the normalized gate leakage current (JG) is shown as function of gate length (LG).

Due to re-oxidation and damage at the gate edges, the normalized gate leakage (JG) is decreased as function of LG. However, the effect is significantly reduced for the devices using a $SF_6$ based chemistry during metal gate etch.

Figure 5B:
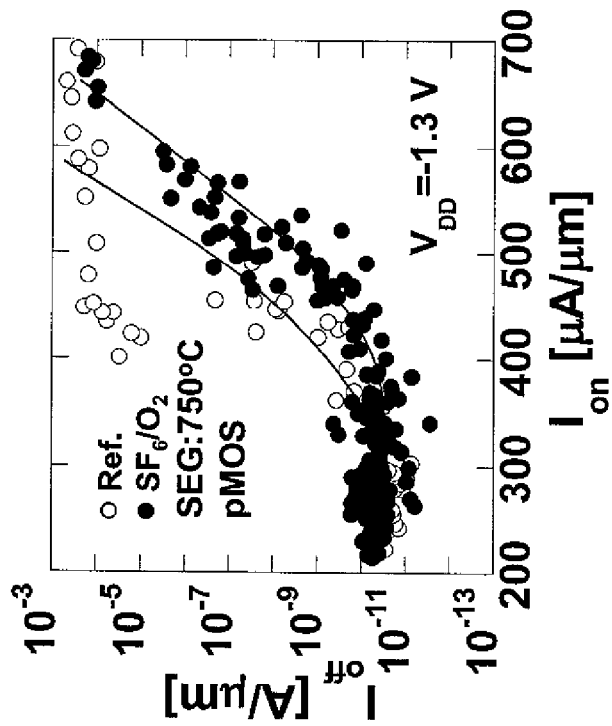
FIGS. 5A and 5B illustrate improved $I_{on}$-$I_{off}$ behavior in nFET (FIG. 5A) and pFET (FIG. 5A) devices having used BCl₃/Cl₂ compared to devices having used SF₆/O₂ to pattern the gate according to the method of the preferred embodiments.
Figure 5A:
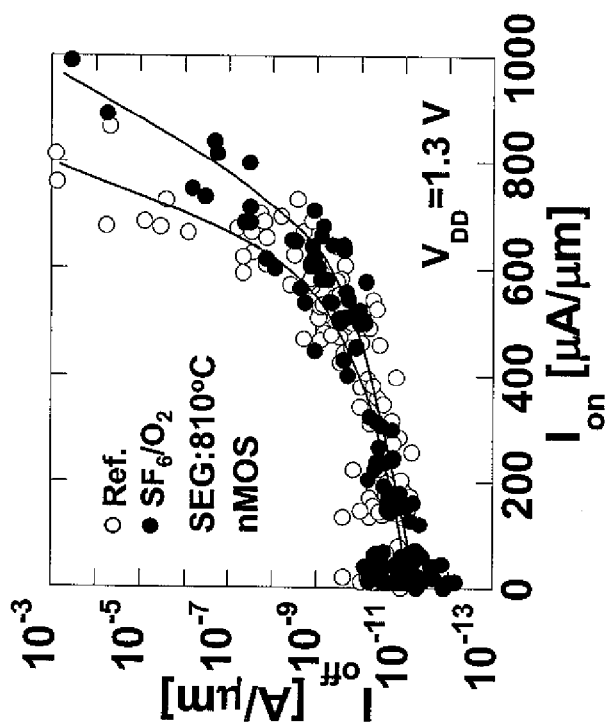

The improved $I_{on}$-$I_{off}$ behavior of nFET and pFET with $SF_6$ is shown in FIGS. 5A and 5B.

Example 3

Reliability Results in Devices Having Fluorine Incorporated in the Gate Dielectric Interrupted stress (0.5 s delay) BTI measurements were performed at stress VG in the |1-2.2| V range and temperatures from 125 to 175° C.

The studied MuGFET devices ($W_{fin} \leq H_{fin}$) have dimensions $W_{fin}=20$ nm, $H_{fin}=60$ nm, $N_{fins}=30$ (various LG). Planar devices ($W_{fin} >> H_{fin}$) have $LG=W_{fin}=1$ µm.

Figure 6:
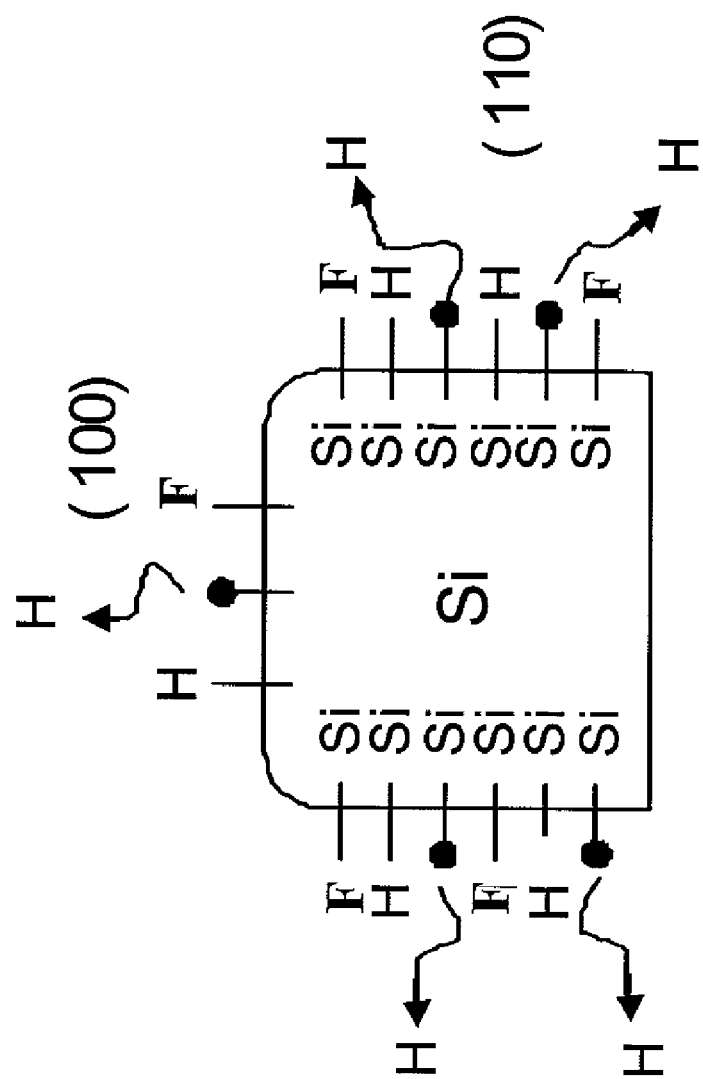
FIG. 6 shows a fin cross section, depicting the difference in interface states density between [100] and [110] Si surface orientation. Depassivation of H passivated Si bonds occurs during the stress (during stress $E_{ox}$=3–8 MV/cm and Temperature=125° C.-175° C.), while the stronger Si—F bonds remain stable.

Si—F and Hf—F bonds have higher dissociation energies than Si—H and Hf—H, and are not broken during stress conditions similar or higher to typical operating conditions, such as temperature of 125-175° C. and electric fields ($E_{ox}$) of 3-8 MV/cm (see FIG. 6).

Figure 7:
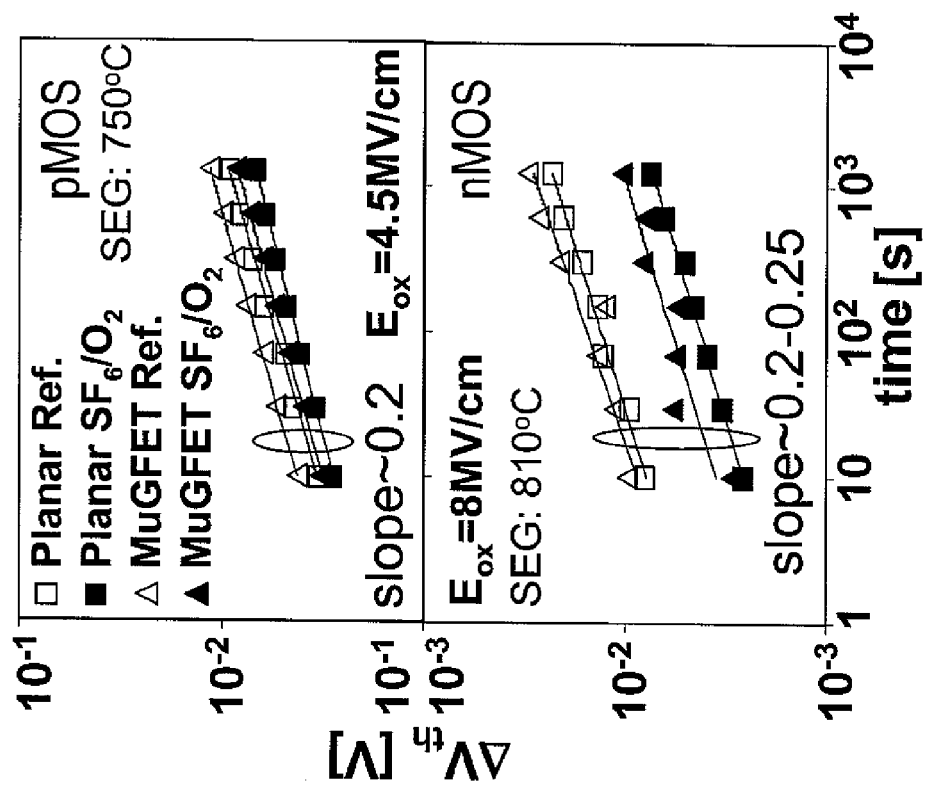
FIG. 7 shows time dependence slopes, consistent with the predicted by the Reaction-Diffusion Model slopes for H diffusion from the interface, indicating that the degradation mechanism is dominated by the interface states more than the bulk states. This is shown for both planar and MuGFET devices, indicating that the degradation mechanism is dominated by the interface states more than the bulk states. pMOS devices having used SF₆/O₂ to pattern the gate according to the method of the preferred embodiments are compared to devices having used BCl₃/Cl₂.

FIG. 7 shows that the $E_{ox}$ distribution in MuGFET and planar SOI devices is similar. As a consequence, the same $E_{ox}$ evaluation method can be used in both cases.

Figure 8:
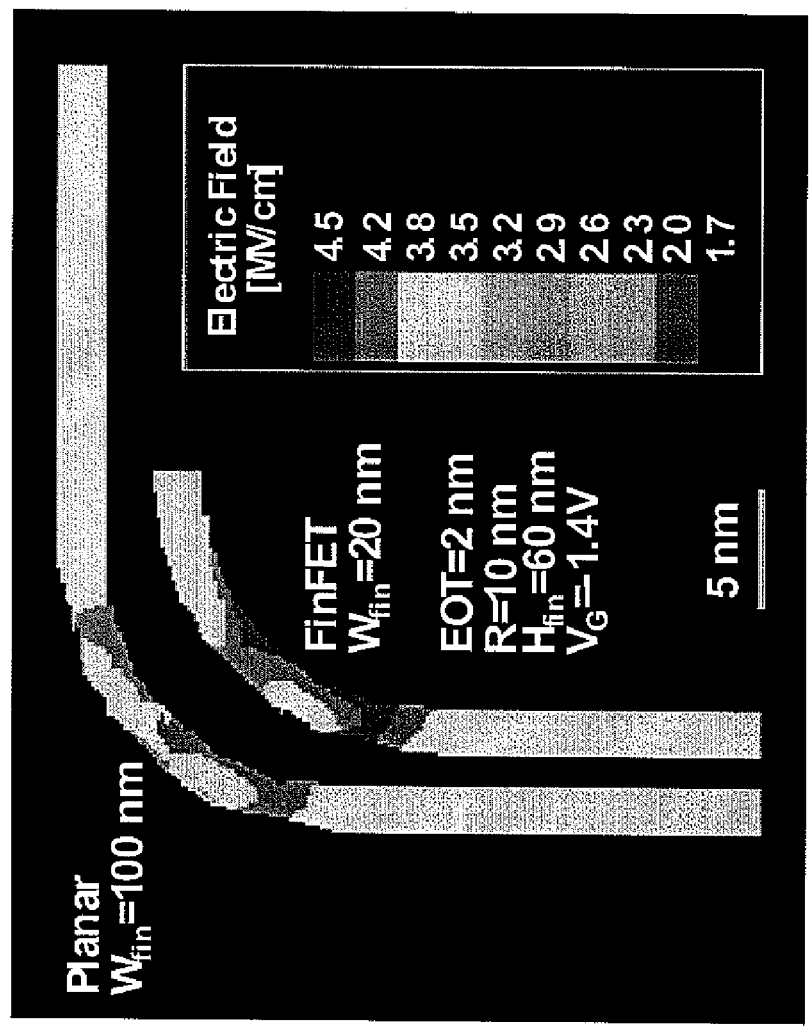
FIG. 8 shows similar electric field distribution profile for both narrow (20 nm) and wide (100 nm) fins, allowing the method for electric field estimation in planar devices to be applied also in MuGFET devices.
Figure 9:
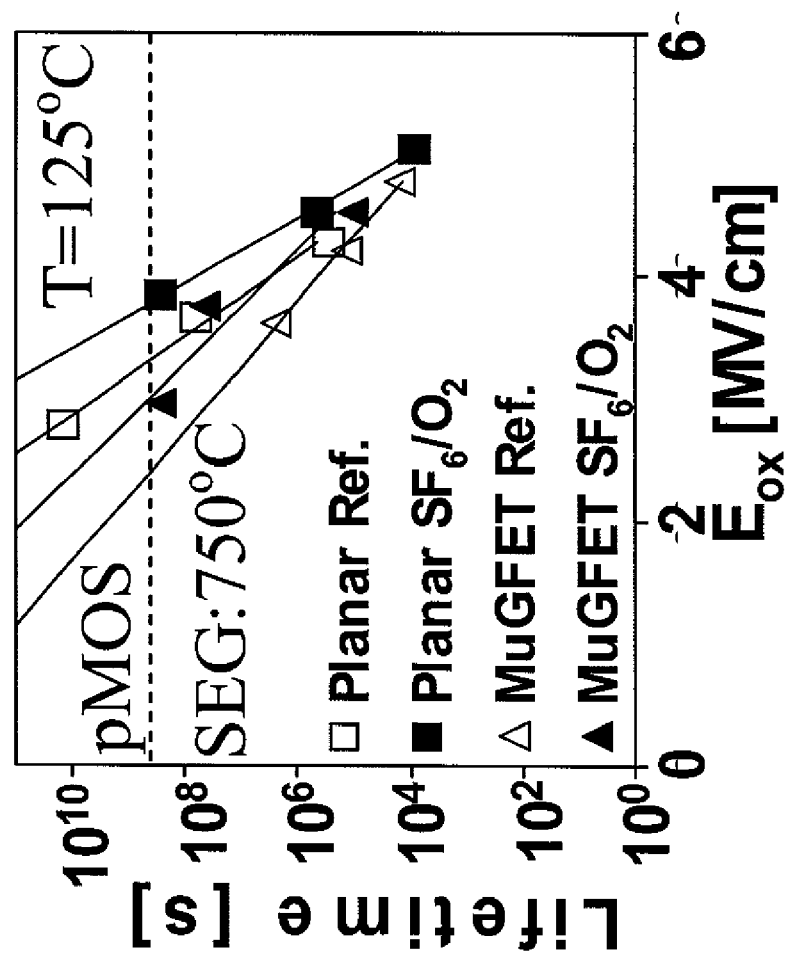
FIG. 9 illustrates NBTI lifetime extrapolations for planar and MuGFET devices. A significant improvement in lifetime is seen in the devices having used SF₆/O₂ to pattern the gate according to the method of the preferred embodiments. Planar devices exhibit better lifetime, due to less interface states present in [100] surface oriented dominant area (MuGFET LG=1 μm).

FIG. 8 shows the NBTI lifetime improvement for devices having used a $SF_6/O_2$ etch chemistry during metal gate etch (and additional selective epitaxial growth (SEG) as described above at 810° C.), as compared to devices having used a $BCl_3/Cl_2$ without Fluorine (and additional selective epitaxial growth (SEG) as described above at 810° C.).

This is shown for both planar and MuGFET devices.

The effective area of planar devices is dominated by the top surface [100], while in MuGFET devices it is dominated by the sidewalls [110] (whereby $A=N_{fins}L_{gate}(W_{fin}+2H_{fin})$).

This improvement demonstrates that F presence at the interface is beneficial for both [100] and [110] Si surface orientations.

The higher lifetime observed in the case of planar devices, compared to the MuGFET devices is consistent with the higher amount of Si bonds in the [110] surface orientation, compared to [100] (see FIG. 6).

The BTI time dependence slopes vary from 0.2 to 0.25 (see FIG. 7). In this case the Reaction-Diffusion model suggests that the degradation mechanism is governed by H diffusion from the interface, rather than by hole trapping.

Figure 10:
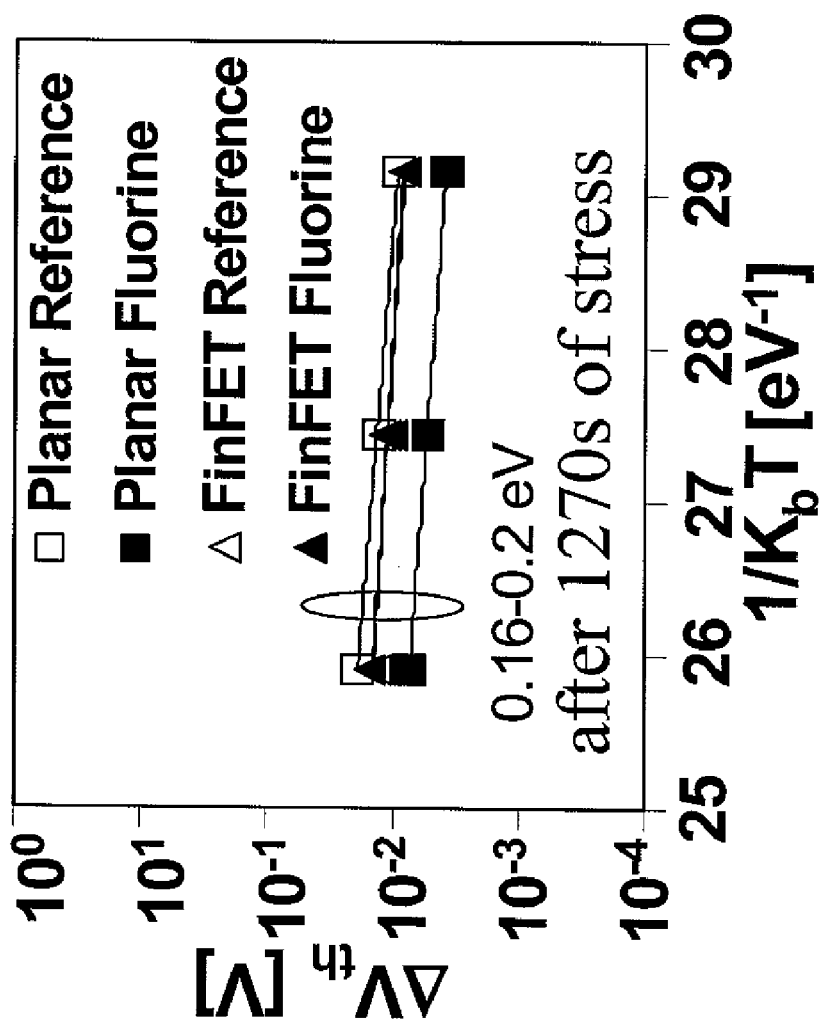
FIG. 10 illustrates the activation energies of planar and MuGFET device (for using BCl₃/Cl₂ (reference) and for using SF₆/O₂ to pattern the gate) are consistent with the predicted Reaction-Diffusion Model activation energies for H diffusion, indicating no Si—F bonds are breaking during stress.

This suggestion is also confirmed by the activation energies (0.16-0.2 eV) shown in FIG. 10.

The reference and F passivated devices exhibit similar degradation mechanisms, governed by hydrogenic diffusion from the interface. This is an indication that during stress only the weaker Si—H/Hf—H bonds dissociate and the lifetime improvement in the case of F passivated devices is due to the presence of stable Si—F/Hf—F bonds at the interface.

Since a detrimental effect of F on the dielectric is known, low frequency 1/f noise measurements were performed to further investigate the dielectric quality.

Figure 11:
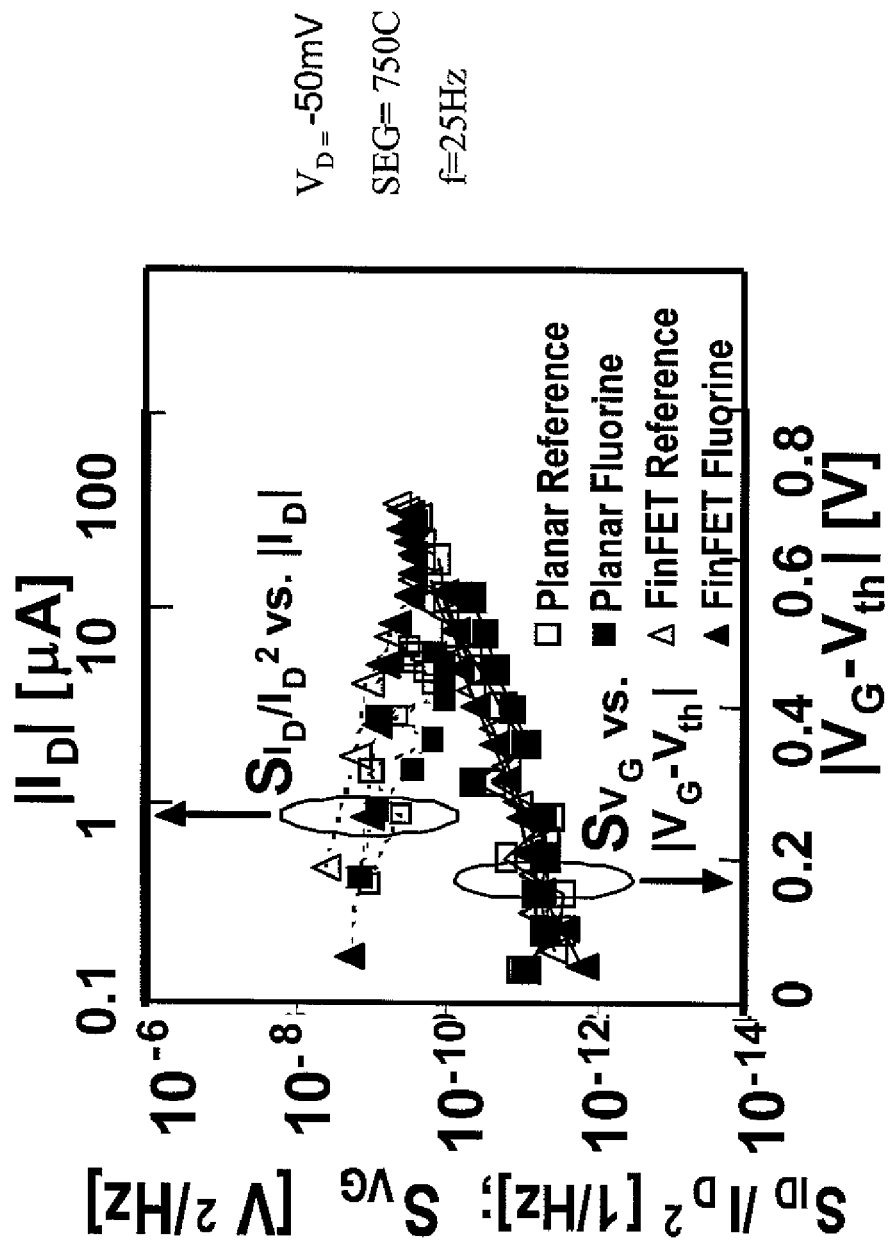
FIG. 11 illustrates the drain current noise spectral density SID and the input referred noise spectral density SVG for planar and MuGFET (for using BCl₃/Cl₂ (reference) and for using SF₆/O₂ to pattern the gate) showing no additional degradation of the gate dielectric due to F introduction.

FIG. 11 shows the drain current noise spectral density SID/ID2 and the scaled input referred noise SVG of the pMOS planar and MuGFET reference and F passivated devices.

No additional dielectric degradation due to F is observed.

The lower noise spectral density in the case of planar devices is consistent with the difference in the dominant surface orientation.

Figure 12:
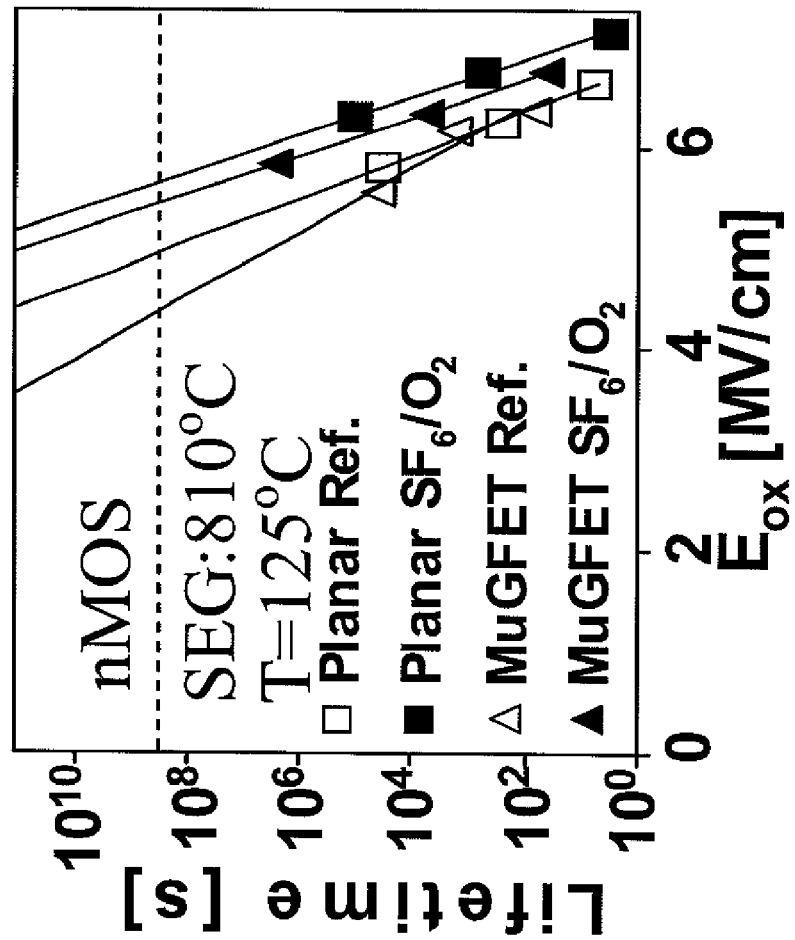
FIG. 12 illustrates the PBTI lifetime extrapolations for planar and MuGFET devices. A significant improvement in lifetime is seen in devices having used SF₆/O₂ to pattern the gate and to passivate the dielectric (MuGFET length gate=1 μm).
Figure 13:
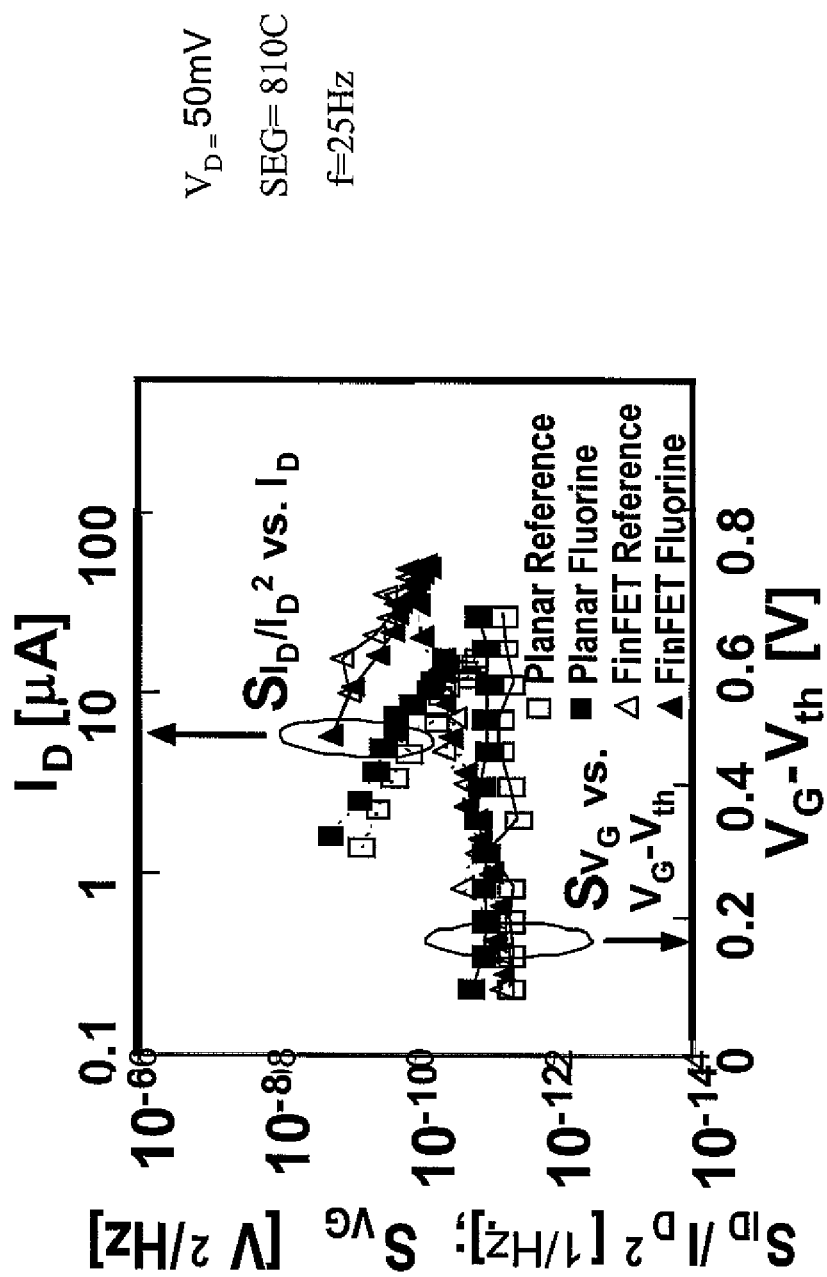
FIG. 13 illustrates the drain current noise spectral density SID and input referred noise spectral density SVG for planar and MuGFET devices (for having used BCl₃/Cl₂ (reference) and for having used SF₆/O₂ to pattern the gate and to passivate the dielectric) nMOS devices, showing no additional degradation of the gate dielectric due to F introduction.

Similar results are obtained for PBTI and 1/f noise in nMOS devices (see FIGS. 12 and 13).

Example 4

Role of the Thermal Budget on nMOS Devices Having Similar Etch Chemistries

In order to investigate the role of the SEG thermal budget, nMOS devices with the same etch chemistries as described in the examples above (the reference using a $BCl_3/Cl_2$ chemistry (no Fluorine) and the chemistry according to the preferred embodiments comprising a $SF_6/O_2$ chemistry) but without SEG were fabricated. In this case the hard mask (HM) was removed without applying a thermal budget beforehand.

Figure 14:
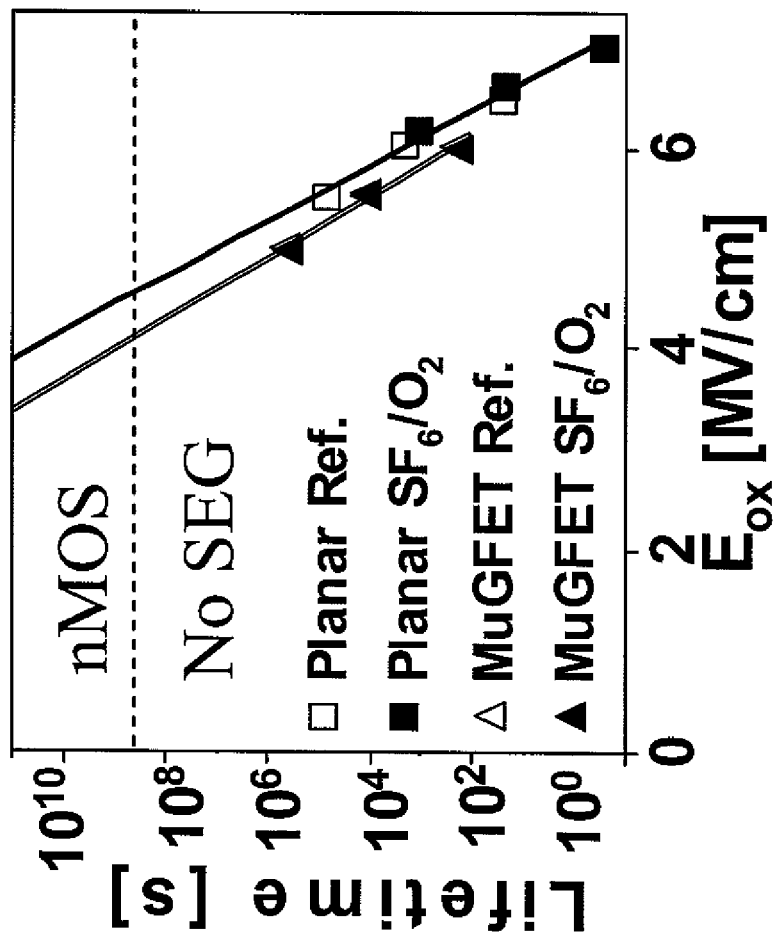
FIG. 14 illustrates the PBTI lifetime extrapolations for planar and MuGFET devices. No impact of etch chemistry is observed for devices without SEG thermal budget (MuGFET LG=1 μm).

FIG. 14 shows no significant difference in lifetimes between reference and $SF_6$-etch devices in this case. Also, no difference is observed in the 1/f behavior and activation energies.

This confirms that the SEG thermal budget is crucial for F diffusion and bonding.

Figure 15:
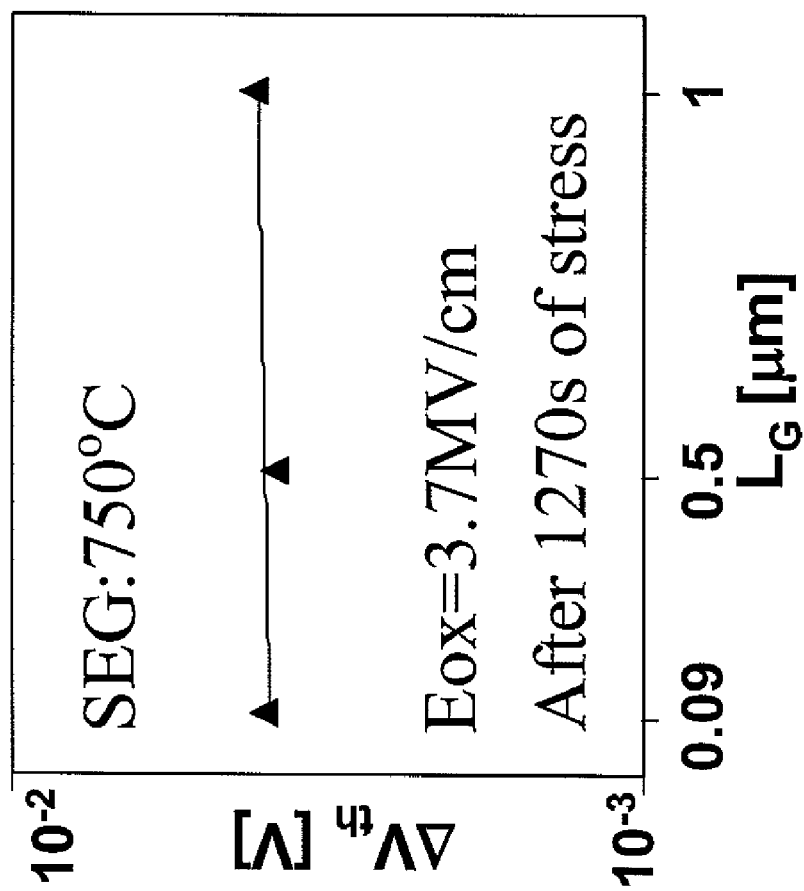
FIG. 15 illustrates no $V_{th}$ (LG) dependence for MuGFET devices having used $SF_6/O_2$ to pattern the gate and to passivate the dielectric, confirming the isotropic nature of the etch.

The lack of $\Delta V_{th}(LG)$ dependence in FIG. 15 suggests isotropic F diffusion from the top as well as from the sidewalls/gate-edges of the devices and that it is not LG dependent.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for fluorine passivation of a high-k dielectric layer, the method comprising the steps of:
   providing gate stack layers comprising at least a channel layer comprising silicon, a high-k dielectric layer comprising Hf, and a metal gate layer;
   exposing the gate stack layers to a fluorine comprising plasma which does not contain carbon compounds; and thereafter
   submitting the exposed gate stack layers to a thermal treatment, wherein the temperature is higher than 700° C., whereby Hf—H bonds are replaced by Hf—F bonds and Si—H bonds are replaced by Si—F bonds at an interface of the channel layer and the high-k dielectric layer, thereby reducing a negative and positive bias temperature instability of a field effect transistor comprising the exposed gate stack layers.

2. The method according to claim 1, wherein exposing the gate stack layers to the fluorine comprising plasma is performed during patterning of the gate stack layers.

3. The method according to claim 1, wherein the step of exposing the gate stack layers to the fluorine comprising plasma is performed simultaneously with or after a step of dry etching the gate stack layers.

4. The method according to claim 1, wherein the step of exposing the gate stack layers to the fluorine comprising plasma comprises dry etching the metal gate using the fluorine comprising plasma.

5. The method according to claim 1, wherein the fluorine comprising plasma comprises $SF_6$.

6. The method according to claim 1, wherein the fluorine comprising plasma further comprises $O_2$.

7. The method according to claim 1, wherein the fluorine comprising plasma comprises a mixture of $SF_6$ and $O_2$.

8. The method according to claim 1, wherein, prior to exposing the gate stack layers to the fluorine comprising plasma, the metal gate layer is partially etched by a $BCl_3$ comprising plasma.

9. The method according to claim 8, wherein the partially etched metal gate layer is further, completely, etched by the fluorine comprising plasma.

10. The method according to claim 8, wherein the $BCl_3$ comprising plasma further comprises $Cl_2$.

11. The method according to claim 1, wherein the gate stack layers further comprise a capping layer on the metal gate layer.

12. The method according to claim 11, wherein the capping layer comprises poly-Si.

13. The method according to claim 1, wherein the metal gate layer comprises a material selected from the group consisting of TiN, $MoSi_2$, Mo, Ti, and combinations thereof.

14. The method according to claim 1, wherein the metal gate layer is a dual metal gate.

15. The method according to claim 1, wherein the dielectric layer comprises $HfO_2$.

16. The method according to claim 1, wherein the dielectric layer comprises hafnium silicon oxide.

17. The method according to claim 1, wherein the channel layer comprises at least Si.

18. The method according to claim 1, wherein the channel layer comprises at least Ge.

19. The method according to claim 1, wherein the channel layer comprises at least a group III/V element.

20. The method according to claim 1, wherein the thermal treatment is performed for at least about 2 minutes.

21. A method for fluorine passivation of a high-k dielectric layer, the method comprising the steps of:
   providing gate stack layers comprising at least a channel layer, a high-k dielectric layer, and a metal gate layer;
   exposing the gate stack layers to a fluorine comprising plasma which does not contain carbon compounds; and thereafter
   submitting the exposed gate stack layers to a thermal treatment, wherein the temperature is higher than 700° C.,
   wherein the thermal treatment step is performed during a selective epitaxial growth process.

22. The method according to claim 1, for use in manufacture of a semiconductor device.

23. The method according to claim 22, wherein the semiconductor device is a multiple gate device, and wherein the channel layer is a fin.

24. A method for fluorine passivation of a high-k dielectric layer, the method comprising the steps of:
   providing gate stack layers comprising at least a channel layer, a high-k dielectric layer, and a metal gate layer;
   exposing the gate stack layers to a fluorine comprising plasma which does not contain carbon compounds without applying a substrate bias, such that no etching occurs; and thereafter
   submitting the exposed gate stack layers to a thermal treatment, wherein the temperature is higher than 700° C.,
   whereby fluorine is incorporated into the high-k dielectric layer, thereby reducing a negative and positive bias temperature instability of a field effect transistor comprising the exposed ate stack layers.

25. The method according to claim 1, wherein the metal gate layer comprises TaC.

26. The method according to claim 1, wherein the metal gate layer comprises a material selected from the group consisting of $WN_2$, TiW, $WSi_2$, and combinations thereof.

27. The method according to claim 1, wherein the gate stack layers are provided on a silicon-on-insulator substrate.

28. The method according to claim 27, wherein the silicon-on-insulator substrate has a [100] Si surface.

29. The method according to claim 27, wherein the silicon-on-insulator substrate has a [110] Si surface 30. The method according to claim 27, wherein the silicon-on-insulator substrate has a [100] Si surface or a [110] Si surface, and wherein
   providing gate stack layers comprises:
      depositing a $SiO_2$ gate dielectric layer on the silicon-on-insulator substrate;
      depositing a $HfO_2$ gate dielectric layer atop the $SiO_2$ gate dielectric layer; and
      depositing, by atomic layer deposition, a TiN layer on top of the $HfO_2$ gate dielectric layer; and wherein
   exposing the gate stack layers to a fluorine comprising plasma which does not contain carbon compounds comprises:
      using an $SF_6/O_2$ plasma etchant to pattern the TiN layer and to passivate interfaces of the $HfO_2$ gate dielectric layer.

31. The method according to claim 30, further comprising, after providing the gate stack layers and before exposing the gate stack layers:
   depositing a poly-silicon capping layer atop the TiN layer; and
   using an oxide hard mask to pattern the poly-silicon capping layer, stopping on the TiN layer.

32. The method according to claim 31, further comprising, after exposing the gate stack layers:
   implanting extensions;
   forming 45 nm recessed nitride spacers by rapid thermal chemical vapor deposition;
   forming a silicon film by selective epitaxial growth at 810° C. on nMOS source/drain regions;
   forming a SiGe film by selective epitaxial growth on pMOS at 750° C.;
   removing the oxide hard mask;
   performing a highly doped drain implantation;
   activating the dopants with a 1050° C. spike anneal;
   removing the oxide hard mask; and
   providing NiSi as a salicide,
   wherein multiple gates are formed, such that a multiple gate field-effect transistor is obtained.

33. The method according to claim 32, wherein the $SiO_2$ gate dielectric layer is 1 nm thick, wherein the $HfO_2$ gate dielectric layer is 2 nm thick, wherein the TiN layer is 5 nm thick.

34. The method according to claim 33, wherein the poly-silicon capping layer is 100 nm thick.

35. The method according to claim 31, further comprising, after exposing the gate stack layers:
   implanting extensions;
   forming 45 nm recessed nitride spacers by rapid thermal chemical vapor deposition;
   forming a silicon film by selective epitaxial growth at 810° C. on nMOS source/drain regions;
   forming a SiGe film by selective epitaxial growth on pMOS at 750° C.;
   removing the oxide hard mask;
   performing a highly doped drain implantation;
   activating the dopants with a 1050° C. spike anneal; and
   removing the oxide hard mask, whereby a planar field-effect transistor is obtained.

36. The method according to claim 35, wherein the $SiO_2$ gate dielectric layer is 1 nm thick, wherein the $HfO_2$ gate dielectric layer is 2 nm thick, wherein the TiN layer is 5 nm thick.

37. The method according to claim 36, wherein the poly-silicon capping layer is 100 nm thick.

* * * * *

UNITED STATES PATENT AND TRADEMARK OFFICE
CERTIFICATE OF CORRECTION

PATENT NO. : 8,319,295 B2
APPLICATION NO. : 11/971845
DATED : November 27, 2012
INVENTOR(S) : Nadine Collaert et al.

It is certified that error appears in the above-identified patent and that said Letters Patent is hereby corrected as shown below:

| Issued Patent | | Description of Discrepancy |
|---|---|---|
| Column | Line | |
| In the Specifications: | | |
| 10 | 40 | Change "$E_{ox}$," to --$E_{ox}$--. |
| 10 | 41 | Change "$E_{ox}$," to --$E_{ox}$--. |
| In the Claims: | | |
| 13 | 36 | In Claim 24, change "ate" to --gate--. |

Signed and Sealed this
Fourteenth Day of May, 2013

Teresa Stanek Rea
*Acting Director of the United States Patent and Trademark Office*